US006998883B2

(12) United States Patent
Skroch

(10) Patent No.: US 6,998,883 B2
(45) Date of Patent: Feb. 14, 2006

(54) SYNCHRONIZATION OF SIGNALS

(75) Inventor: Jonathan P. Skroch, West Roxbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/787,841

(22) Filed: Feb. 25, 2004

(65) Prior Publication Data

US 2005/0184769 A1    Aug. 25, 2005

(51) Int. Cl.
H03L 7/00    (2006.01)
(52) U.S. Cl. ............... 327/141; 327/142; 327/199; 327/298
(58) Field of Classification Search ........... 327/141–3, 327/198–200, 207, 208, 212, 291, 293, 298, 327/142
See application file for complete search history.

(56) References Cited

U.S. PATENT DOCUMENTS

| | | | | |
|---|---|---|---|---|
| 3,723,760 A | * | 3/1973 | Ebrahimi | 370/298 |
| 4,337,435 A | * | 6/1982 | Munoz | 327/12 |
| 4,517,473 A | * | 5/1985 | Chidester | 327/142 |
| 4,968,906 A | * | 11/1990 | Pham et al. | 327/291 |
| 5,034,967 A | * | 7/1991 | Cox et al. | 375/373 |
| 5,327,394 A | * | 7/1994 | Green et al. | 365/233.5 |
| 5,652,536 A | * | 7/1997 | Nookala et al. | 327/298 |
| 5,745,914 A | * | 4/1998 | Connolly et al. | 711/105 |
| 5,764,710 A | * | 6/1998 | Cheng et al. | 375/371 |
| 5,811,995 A | * | 9/1998 | Roy et al. | 327/99 |
| 6,043,970 A | * | 3/2000 | Song et al. | 361/111 |
| 6,163,584 A | * | 12/2000 | Weng et al. | 375/354 |
| 6,205,192 B1 | * | 3/2001 | Igura | 375/354 |
| 6,222,392 B1 | * | 4/2001 | Guo et al. | 327/20 |
| 6,400,195 B1 | * | 6/2002 | Bhaskaran | 327/142 |
| 6,556,057 B1 | * | 4/2003 | McClure | 327/143 |
| 6,762,632 B1 | * | 7/2004 | Himpe et al. | 327/142 |

* cited by examiner

Primary Examiner—My-Trang Nu Ton
Assistant Examiner—An T. Luu
(74) Attorney, Agent, or Firm—Wolf, Greenfield & Sacks P.C.

(57) ABSTRACT

A circuit and method are provided to enable the synchronization of an on-demand, synchronous signal with an asynchronous signal. The synchronous signal is activate only for a portion of the period of the asynchronous signal, thus providing beneficial power conservation. The synchronous signal is activated in response to a first edge of the asynchronous signal, and deactivated in response to a second edge of the asynchronous signal.

17 Claims, 3 Drawing Sheets

SYNCHRONIZATION OF SIGNALS

BACKGROUND OF INVENTION

1. Field of Invention

The invention relates to synchronization of signals, and more specifically to a circuit and method for synchronizing an asynchronous signal with a synchronous, on-demand, oscillating signal.

2. Discussion of Related Art

In processor applications it is often desirable, or even necessary, to synchronize actions performed at a first clock frequency with actions performed at a second clock frequency. For example, read and write operations from registers may be performed at different speeds. For instance, the register may be written to, or updated, once every second, while the circuitry that reads from the register and manipulates, decodes, stores, or otherwise operates on data in the register may be controlled by a clock signal of higher frequency, for example 100 MHz. In such a situation, the circuitry controlled by the 100 MHz clock may complete the manipulation of the data in the register in advance of the register being updated again. If the circuitry controlled by the 100 MHz clock were to continue to read data from the register and manipulate the data, its operation would be redundant, since the register had not yet been updated with new data.

Worse, the continuous operation of the 100 MHz circuitry would be inefficient, since circuits that produce, or are controlled by, oscillating signals often consume power during operation; namely, in the process of changing the state of a signal from low to high, or vice versa. Therefore, circuits which produce, or are controlled by, an oscillating signal with a high frequency are likely to consume more power than a comparable circuit producing, or operating under the control of, an oscillating signal with a low frequency. In effect, substantial power may be consumed in continuously producing a high frequency oscillating signal, despite the fact that the signal is only needed for a portion of the time it is being run. As processor clocking speeds continue to increase, this amount of power will likely increase as well. Thus, efficient circuits and methods for synchronizing an asynchronous signal with an on-demand synchronous signal are needed.

SUMMARY OF INVENTION

One aspect of the invention provides an accurate and power efficient circuit and method for synchronizing an asynchronous signal with an on-demand, synchronous oscillating signal.

According to one aspect of the invention, a method of synchronizing an asynchronous signal having at least a falling edge and a rising edge with a synchronous signal is provided. The method comprises activating the synchronous signal in response to one of the falling edge and the rising edge of the asynchronous signal, and deactivating the synchronous signal in response to the other of the rising edge and the falling edge of the asynchronous signal. According to one embodiment, the synchronous signal exhibits a frequency of oscillation that is great enough to allow the synchronous signal to complete at least one cycle during a time between one of the falling edge and the rising edge and the other of the rising edge and the falling edge.

According to another aspect of the invention, a digital circuit for synchronizing an asynchronous signal having at least a falling edge and a rising edge with a synchronous signal is provided. The synchronous signal exhibits a frequency of oscillation that is great enough to allow the synchronous signal to complete at least one cycle during a time between one of the falling edge and the rising edge and the other of the rising edge and the falling edge. The digital circuit comprises a first AND gate having a first input connected to receive the asynchronous signal, a second input connected to receive a second signal, a third input connected to receive a third signal, and an output to output a first output signal.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
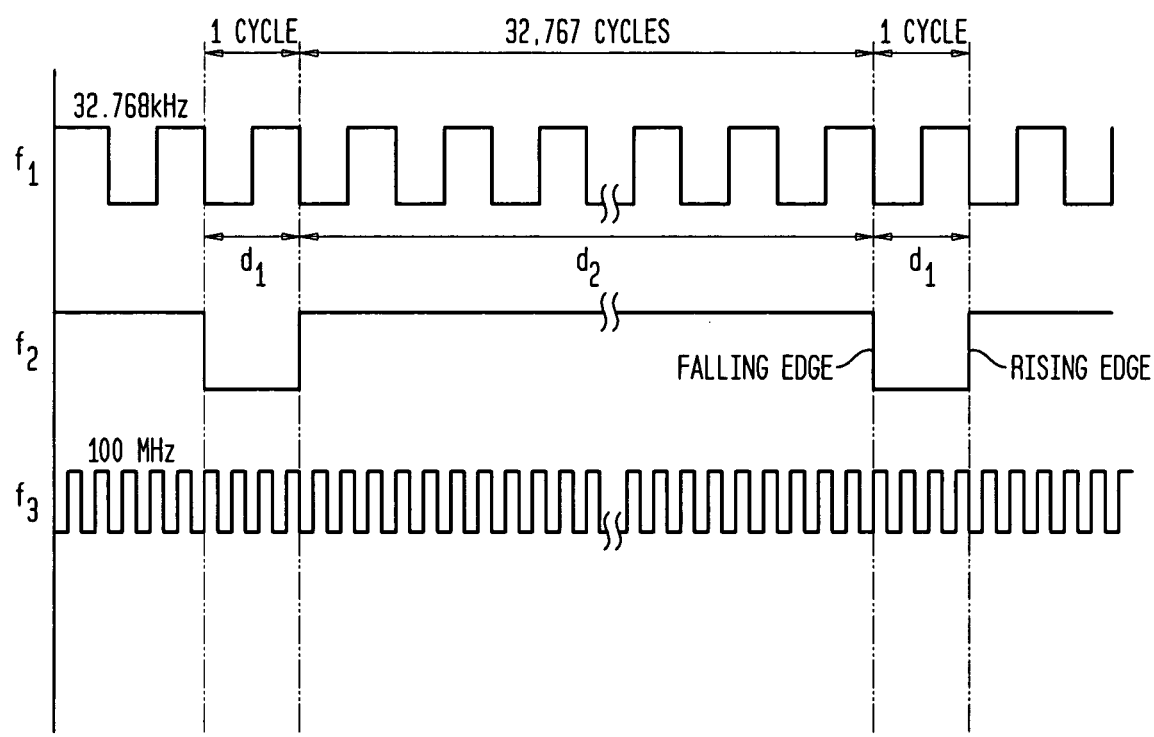
FIG. 1 illustrates signals of different frequency to which the circuit and method of the present invention may apply. Note that the signals are not drawn to scale.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

The present invention will now be described by way of a specific, non-limiting, example. It should be understood that the invention applies to systems and circuits beyond those discussed here. Specific values of frequencies and other circuit parameters are meant for illustrative purposes only, and are non-limiting. For purposes of this application, the term "synchronous" refers to signals and events that occur at specific times of a common timing signal. The term "asynchronous" refers to signals or events which may occur at any time relative to a common timing signal.

An aspect of the invention may apply to any circuit or system with two or more signals, where at least one of the signals is asynchronous and another of the signals is synchronous, and wherein the time duration between consecutive edges of the asynchronous signal is great enough as to allow at least one cycle of the synchronous signal to complete. For example, the present invention may find application in a processor in which multiple clocking domains are provided. FIG. 1 illustrates three signals which may be associated with a processor. It should be noted that the frequencies of the signals in FIG. 1 are not drawn to scale.

A first signal $f_1$ having a frequency of 32.768 kHz and an equal, 50%, high and low duty cycle may be provided to the processor, or a portion thereof, by a crystal oscillator located externally to the processor. Signal $f_1$ could also be produced by any other known means for producing an oscillating signal. Signal $f_1$ could be downsampled to produce an asynchronous signal $f_2$, having a lower frequency than signal $f_1$. In this non-limiting example $f_2$ has a frequency of 1 Hz. It is assumed that signal $f_2$ includes at least one falling edge and at least one rising edge, as illustrated in FIG. 1. While signal $f_1$ exhibited a 50% high and low duty cycle, it will be desirable, if possible, to form signal $f_2$ with the high and low states having unequal duty cycles, for reasons to be discussed later. In this non-limiting example the high state of signal $f_2$ has a duration of $d_2$, equal to 999.97 ms, or 32,767 cycles of signal $f_1$. The low state of signal $f_2$ has a duration of $d_1$, equal to 30.52 μs, or 1 cycle of signal $f_1$. It should be appreciated that in this example $d_2$ is so much greater than $d_1$ that $d_1$ is effectively "zero." Alternatively, signal $f_2$ may be produced by other means than those described, which are meant for illustrative purposes only.

Synchronous signal $f_3$ may be a signal provided by another crystal oscillator, or by any other known methods. The frequency of signal $f_3$ is such that at least one cycle of $f_3$ may be completed between any two consecutive edges of $f_2$. In some cases it may be necessary that $f_3$ complete at least two cycles between any two consecutive edges of $f_2$. For example, the frequency of $f_3$ may be 100 MHz. Alternatively, $f_3$ could have other frequencies. Signal $f_3$ is synchronous in that the timing of circuit operations occurs at specific times of $f_3$, typically at a rising or falling edge of $f_3$. The falling edge and rising edge of $f_2$ are both asynchronous, in that they are not required to occur at specific times, but rather, may occur at any time during the cycle of $f_3$.

One of skill in the art will recognize that the indicated frequency and duty cycle of $f_2$ are non-limiting, and that the invention applies to any frequency and duty cycle, including signals with equal high and low duty cycles. In fact, all that is necessary is that the asynchronous signal, $f_2$, has at least a falling edge and at least a rising edge, and that the time duration between any two consecutive edges of $f_2$ is great enough to allow at least one cycle of signal $f_3$ to complete. In some cases it may be necessary that $f_3$ complete at least two cycles between any two consecutive edges of $f_2$. In other words, $f_2$ need not be periodic in any way, and the invention may find application in systems where $f_2$ is not periodic, but rather exhibits random oscillations.

For illustrative purposes only, it will be assumed that signals $f_2$ and $f_3$ have specific functions or meanings within the processor. For instance, data may be written to a register on a rising edge of asynchronous signal $f_2$, i.e., once per second. Signal $f_3$ may control circuitry that reads data from the register and operates on the data. Signal $f_3$ is thus an on-demand signal, in that its operation need not be continuous, but rather, is desired after the register has been written to, or updated, i.e., in this non-limiting example, once per second. It is desired to activate synchronous signal $f_3$ for as short a time as possible so as to save power and minimize redundancy of processor operations. It is thus necessary to determine appropriate times at which to activate and deactivate signal $f_3$.

While $f_3$ could be active at any point during the cycle of signal $f_2$, i.e., during the high state only, the low state only, or a transition between the high and low states, it is simplest to synchronize the operation of $f_3$ to a transition state (high-to-low, or low-to-high) of asynchronous signal $f_2$. This is especially true in situations in which $f_2$ may not be periodic, but rather exhibits random oscillations. Thus, in this non-limiting example it is desired to detect an edge of $f_2$, so that, for instance, signal $f_3$ will always be active during the rising edge of $f_2$, at which time the data written to the register is stable. To accomplish this, the present invention takes advantage of the observation that the asynchronous rising edge of signal $f_2$ may be foreshadowed by the asynchronous falling edge of $f_2$. Thus, signal $f_3$ may be activated in response to the asynchronous falling edge of signal $f_2$ such that signal $f_3$ will be active during the ensuing asynchronous rising edge of signal $f_2$. Signal $f_3$ may then be deactivated in response to the asynchronous rising edge of signal $f_2$. By this method, signal $f_3$ will not be active for the entire period of $f_2$, so that power will be conserved.

Figure 2:
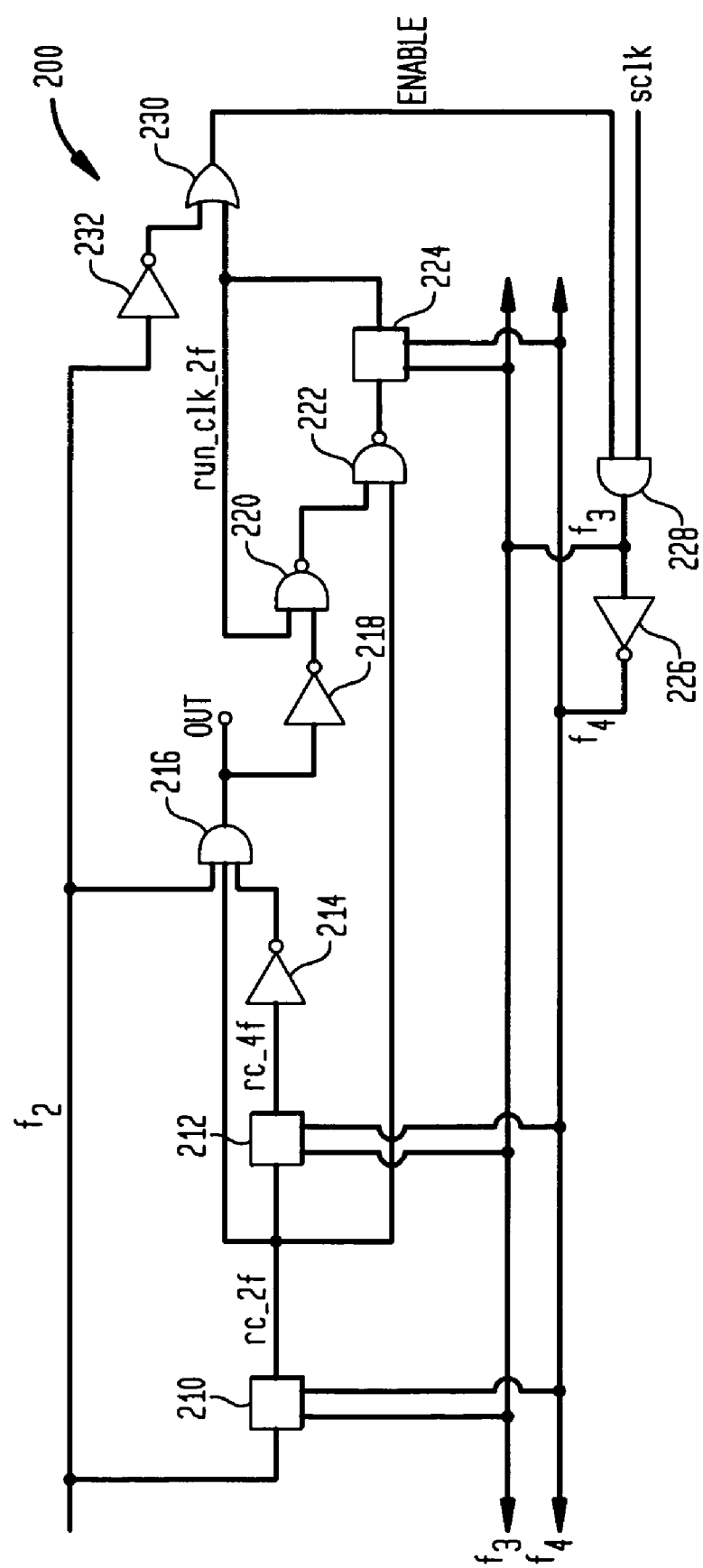
FIG. 2 is an illustration of a circuit for synchronizing an asynchronous signal with a synchronous, on-demand, oscillating signal according to the present invention.

FIG. 2 is an illustration of a circuit according to the present invention. The circuit 200 enables signal $f_3$ to become active in response to an asynchronous falling edge of signal $f_2$, and then to become inactive in response to the ensuing asynchronous rising edge of signal $f_2$. To begin, a signal sclk is input to one input of AND gate 228. In this example, signal sclk is produced externally to the circuit 200, and is used to generate signal $f_3$. In other words, signal $f_3$ is a gated version of signal sclk. However, as mentioned previously, signal $f_3$ could be produced by any other means. Asynchronous signal $f_2$ is input to synchronization register 210, AND gate 216, and inverter 232. The output of inverter 232 is input to OR gate 230, the output of which, enable, is connected to a second input of AND gate 228. When enable is high the output of AND gate 228, $f_3$, follows sclk. Signal $f_3$ is also input to inverter gate 226 to produce signal $f_4$. Signals $f_3$ and $f_4$ are not only provided to circuit 200, but may be provided to other circuitry (not shown), for example circuitry that reads data from a register.

Signals $f_3$ and $f_4$ are provided as clocking inputs to synchronization register 210. Synchronization register 210 may be a standard register configured as a synchronization register. When signals $f_3$ and $f_4$ are inactive, the output of synchronization register 210, rc_2f, will be static. When signals $f_3$ and $f_4$ are active, the output of synchronization register 210, rc_2f, follows the input, $f_2$, with a delay. In particular, when actively clocked, the synchronization register operates to translate any asynchronous edge of $f_2$ into a synchronous edge of rc_2f, as will be described further in connection with FIG. 3. Synchronization register 210 may comprise one or more delay latches, and the number of delay latches may be chosen to optimize the settling time of signal rc_2f, as would be known to one of skill in the art.

Signal rc_2f is input to one terminal of AND gate 216, to delay register 212, and to one input of NAND gate 222. Delay register 212 can be a standard digital delay register, and may function as a combination of two delay latches. Delay register 212 is clocked by signals $f_3$ and $f_4$, so that when signals $f_3$ and $f_4$ are active the output rc_4f will be a delayed version of the input, rc_2f. In this non-limiting example, the delay is equivalent to one cycle of signal $f_3$. However, any number of delay registers could be used to achieve a desired delay, and the invention is not limited to any specific number of delay registers. Signal rc_4f is input to inverter 214, the output of which is input to AND gate 216. Thus, AND gate 216 receives $f_2$, rc_2f, and an inversion of rc_4f as inputs. The output of AND gate 216, OUT, is input to inverter 218, the output of which is input to NAND gate 220. The output of NAND gate 220 is a second input to NAND gate 222. A second input of NAND gate 220 is the output of delay register 224, run_clk_2f. Delay register 224 is clocked by signals $f_3$ and $f_4$, and receives the output of NAND gate 222 as an input. Delay register 224 may be a standard digital delay register, and may function as a combination of two delay latches. In this non-limiting example, run_clk_2f is delayed a duration of one cycle of signal $f_3$ from the output of NAND gate 222 by delay register 224. However, any number of delay registers could be used to obtain a desired delay duration, and the invention is not limited to any specific number of delay registers. It should also be appreciated that the combination of NAND gate 220, NAND gate 222, and delay register 224 operates as a synchronous set/reset circuit of signal run_clk_2f, and could be replaced by any standard synchronous set/reset circuit. It should also be appreciated that the circuit of FIG. 2 prevents unwanted transitions of the signal OUT, which may otherwise arise due to uncertain states of digital components or unclean rising and falling edges of circuit signals.

Figure 3:
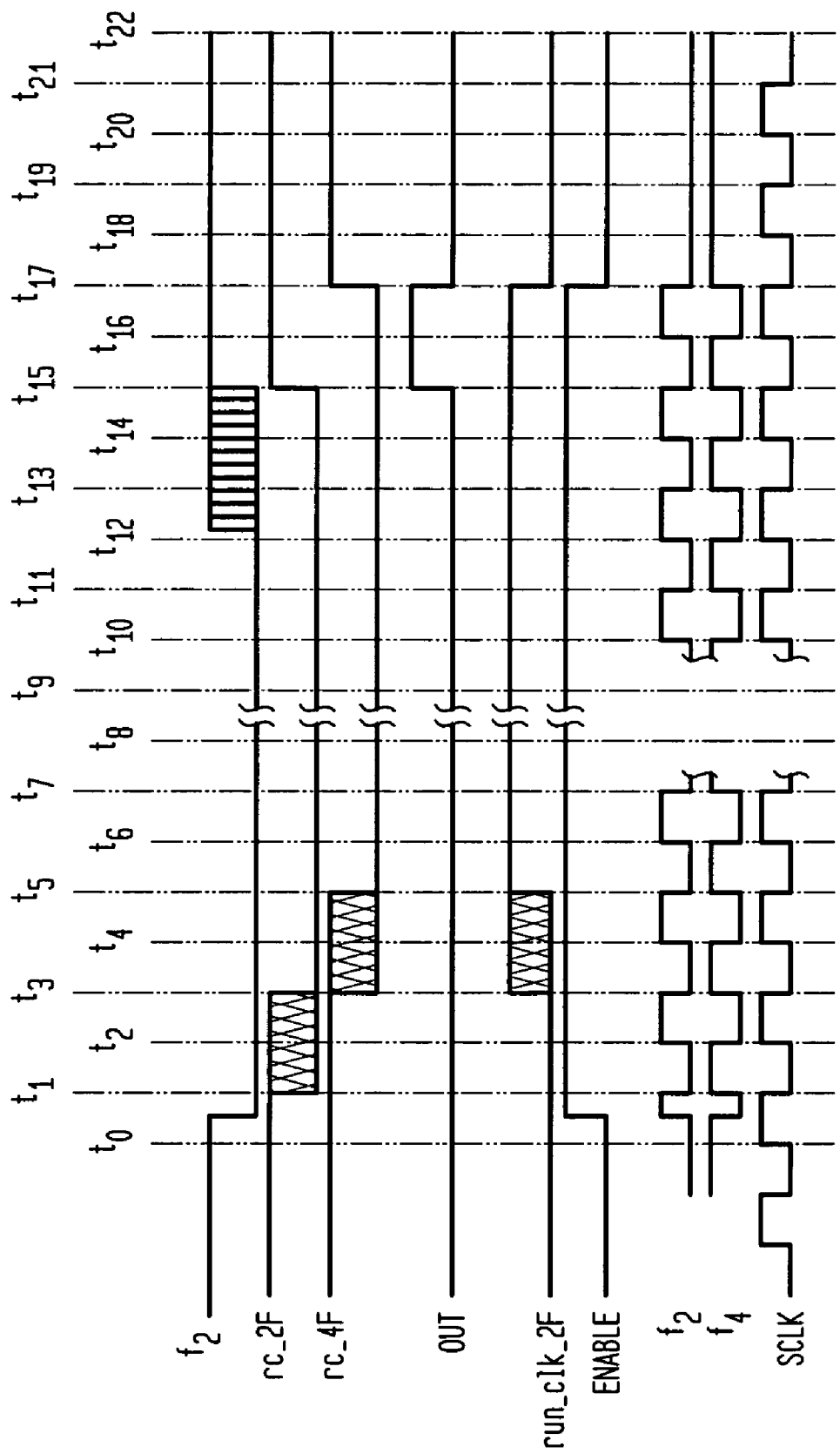
FIG. 3 is a timing diagram illustrating the synchronization sequence according to the present invention.

The operation of circuit 200 will now be described with reference to FIG. 3. Prior to a time $t_0$ it is assumed that $f_2$ is in a high state, and that the circuit 200 has had time to stabilize. In general, signal rc_2f is static when signals $f_3$ and $f_4$ are not active, and follows signal $f_2$ when signals $f_3$ and $f_4$ are active. It is assumed that prior to $t_0$ signal rc_2f is high and in a static state, and therefore the inversion of signal rc_4f is low, so that OUT is also low. The output of inverter 218 is thus high. The delay register 224 must initially be set low, but subsequently the circuit operation will return the output to its initially low state without the need for external intervention. Thus, it is assumed that prior to $t_0$ the output of delay register 224, run_clk_2f, is low. Since the output of delay register 224 is low, as is the output of inverter 232, enable is also low, so that signals $f_3$ and $f_4$ are inactive. The signal sclk is active.

As illustrated, an asynchronous falling edge of $f_2$ occurs at some time between times $t_0$ and $t_1$. As mentioned, since $f_2$ is asynchronous it may have a falling edge or rising edge at any time relative to the cycle of $f_3$, and thus is not restricted to transition at any fixed time of the cycle of $f_3$, such as $t_0$, $t_1$, $t_2$, $t_3$, etc. The output of inverter 232 is driven high, so that enable also has an asynchronous rising edge. Therefore, signals $f_3$ and $f_4$ are asynchronously triggered, in response to the asynchronous falling edge of signal $f_2$. With signals $f_3$ and $f_4$ active, synchronization register 210 is actively clocked, so that signal rc_2f follows signal $f_2$ with a synchronous falling edge. However, since it takes some time for the signals $f_3$ and $f_4$ to propagate to synchronization register 210, it is not known at exactly what time signal rc_2f has a falling edge. It is known that the falling edge of rc_2f will occur at some time $t_1$ or $t_3$, as indicated by the cross-hatching. Accordingly, signal rc_4f will also display a falling edge at time $t_3$ or $t_5$, respectively, appropriately delayed from the falling edge of signal rc_2f by one cycle of signal $f_3$. As mentioned, any number of delay registers 212 could be used to obtain a desired delay duration of signal rc_4f, and the invention is not limited to any specific number of delay registers. With OUT and rc_2f low, the output of NAND gate 222 will be driven high. Thus, the output of delay register 224, run_clk_2f, displays a corresponding rising edge at time $t_3$ or $t_5$. Thus, if the asynchronous falling edge of $f_2$ occurs at any time between $t_0$ and $t_1$, the circuit 200 reaches a stable state by time $t_5$. No further changes will occur during the time $t_5$–$t_{12}$.

The importance of AND gate 216 should be realized. Since the falling edge of $f_2$ is asynchronous, it may occur at any time, for example, in the range from $t_0$ to $t_2$. If the asynchronous falling edge occurs at a point in the cycle of sclk for which sclk is in a low logic state, for instance between times $t_1$ and $t_2$, no problems arise. However, if the asynchronous falling edge occurs at a time at which sclk is in a high logic state, problems may arise. More specifically, as shown, the falling edge of $f_2$ occurs between times $t_0$ and $t_1$. Thus, signal $f_3$ assumes a high logic state for a shortened period of time, i.e., from the time of the asynchronous falling edge of $f_2$ to time $t_1$, which is shorter in duration than the normal high logic state would be; specifically, from time $t_0$ to $t_1$. This shortened feature of signal $f_3$ may be referred to as a glitch, and the design of circuit 200 accounts for such undesired glitches. If this shortened high logic state of signal $f_3$ is allowed to control circuitry, such as registers, read and write operations may not be completed appropriately, since the read and write operations may require a longer processing time than the time from the asynchronous falling edge of $f_2$ until time $t_1$. An undesired output OUT may occur. However, by providing a third input, signal $f_2$, to AND gate 216, the asynchronous falling edge of $f_2$ acts to prevent any unwanted circuit behavior that $f_2$ itself may cause due to its asynchronous nature.

At some time between $t_{12}$ and $t_{14}$, an asynchronous rising edge of signal $f_2$ occurs, as indicated by the slash marks. Since signals $f_3$ and $f_4$ are active, signal rc_2f will synchronously follow the rise of $f_2$, with an appropriate delay, at time $t_{15}$. Since $f_2$ and rc_2f are high, and the inversion of signal rc_4f remains high, due to the fact that the rising edge has not yet propagated through delay register 212, the output OUT displays a rising edge at time $t_{15}$. Signal rc_4f will display a rising edge at a time $t_{17}$, and the inversion of rc_4f will display a falling edge at the same time, thus driving signal OUT low. Thus, the signal OUT displays a single pulse between $t_{15}$ and $t_{17}$ that indicates a rising edge of $f_2$ has occurred. Such a pulse could be used, for instance, to activate a read operation from a register.

With rc_2f high, and the output of NAND gate 220 also high at time $t_{15}$, the output of delay register 224, run_clk_2f, will be driven low at time $t_{17}$. With run_clk_2f low, and the output of inverter 232 also low, enable will be driven low at time $t_{17}$, thus deactivating signals $f_3$ and $f_4$. In this manner, then, signal $f_3$ was only active for a portion of the operation time of the circuit. As discussed previously in connection with FIG. 1, if the duration of the low state of $f_2$ is 30.52 $\mu s$, while the duration of the high state of $f_2$ is 999.97 ms, then signals $f_3$ and $f_4$ are almost always deactivated. Thus, considerable power savings may be realized. However, it should be appreciated that the circuit of FIG. 2 will operate appropriately regardless of the duty cycles of the high and low states of signal $f_2$. It should also be appreciated that the asynchronous rising edge of $f_2$ may occur at any point between times $t_{12}$ and $t_{14}$, with the remaining signals of FIG. 3 remaining unchanged. It should also be realized that signal $f_2$ has been described as an active low signal, but an active high signal could also be used by inputting the active high signal into an inverter, and then into circuit 200 at the point of $f_2$.

The importance of OR gate 230 should also be realized. As described, combining asynchronous and synchronous signals in a circuit may lead to undesired or unexpected behavior, such as glitches. While the asynchronous falling edge of $f_2$ may trigger enable asynchronously, thus leading to asynchronous edges of $f_3$ and $f_4$, the asynchronous rising edge of $f_2$ will always precede a synchronous falling edge of enable. This is because signal run_clk_2f is a synchronous signal, and the synchronous falling edge of run_clk_2f drives the signal enable low. Thus, signals $f_3$ and $f_4$ are deactivated with synchronous edges, so that they do not exhibit any glitches upon deactivation. This characteristic may improve the stability of circuit 200 or other circuitry controlled by signals $f_3$ or $f_4$.

As mentioned, any number of delay registers can be used in place of delay registers 212 and 224 to optimize the operation of circuit 200 for specific considerations. The addition of delay at the point of delay register 212 would function to increase the duration of the high state pulse of signal OUT. The addition of delay at the point of delay register 224 would function to shift the pulse of run_clk_2f to a later point in time, depending on the amount of delay added. Additionally, delay registers may be added between signal OUT and inverter 218. Such delay registers may function to prolong the active state of signal $f_3$ and $f_4$ beyond the asynchronous rising edge of signal $f_2$. For example, the addition of a single delay register between OUT and inverter 218 may maintain $f_3$ and $f_4$ in an active state for a duration of one cycle of $f_3$ beyond the asynchronous rising edge of signal $f_2$. Each additional delay register may function to prolong the active state of $f_3$ and $f_4$ by an additional cycle of signal $f_3$. The addition of such delay registers would also function to maintain the high logic states of signals enable and run_clk_2f for as long as signals $f_3$ and $f_4$ remain active. Signals $f_2$, rc_2f, rc_4f, OUT, and sclk would be unaffected by the addition of delay registers between OUT and inverter 218.

As mentioned in the description of FIG. 2, the combination of NAND gate 220, NAND gate 222, and delay register 224 operates as a synchronous set/reset circuit of signal run_clk_2f. More specifically, signal run_clk_2f is set high by a low state of rc_2f, and then signal run_clk_2f is reset to a low state by a high state of OUT. Thus, the combination of NAND gate 220, NAND gate 222, and delay register 224 could be replaced by any standard synchronous set/reset circuit that receives signals rc_2f and OUT as inputs, and outputs signal run_clk_2f.

Also, it should be noted that in this non-limiting example signals $f_3$ and $f_4$ have been described as gated versions of signal sclk. However, signals $f_3$ and $f_4$ could alternatively be formed as non-overlapping clock signals, without departing from the nature of the invention. Signal sclk could be input to a non-overlapping clock generator, as would be known to one skilled in the art. Signals $f_3$ and $f_4$ could then be out-of-phase with each other, with each signal exhibiting a longer low state duty cycle than high state duty cycle. For example, the low states of $f_3$ and $f_4$ could have a 54% duty cycle, while the high states could have a 46% duty cycle. The invention is not limited to any specific high and low duty cycles of signals $f_3$ and $f_4$.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method controlling a synchronous signal, the method comprising acts of:
   synchronizing an asynchronous control signal in response to the synchronous signal to form a synchronized control signal;
   activating the synchronous signal in response to an edge of the asynchronous control signal; and
   deactivating the synchronous signal in response to an edge of the synchronized control signal;
   wherein the synchronous signal exhibits a frequency of oscillation that is great enough to allow the synchronous signal to complete at least one cycle during a time between consecutive edges of the asynchronous control signal.

2. The method of claim 1, wherein the at least one cycle includes at least two cycles.

3. The method of claim 1, wherein the asynchronous signal has a duty cycle that is not 50%.

4. The method of claim 1, wherein the asynchronous signal exhibits random oscillations at edges thereof.

5. The method of claim 1, wherein the synchronous signal is activated at substantially the same time as the edge of the asynchronous control signal.

6. The method of claim 1, wherein the synchronous signal remains active for a duration of two cycles of the synchronous signal after the occurrence of the edge of the synchronized control signal.

7. The method of claim 1, wherein the act of activating the synchronous signal in response to the edge of the asynchronous control signal includes providing a first logic gate having an input connected to receive an inversion of the asynchronous signal and an output to output a signal to activate the synchronous signal.

8. The method of claim 1, further comprising an act of:
   generating an event signal in response to the edge of the synchronized control signal, the event signal having first and second edges, wherein a processor action is commenced in response to the first edge of the event signal and ceased in response to the second edge of the event signal.

9. The method of claim 8, wherein the act of deactivating the synchronous signal in response to the edge of the synchronized control signal occurs no sooner than the second edge of the event signal.

10. A circuit for controlling a synchronous signal, the circuit comprising:
    a first circuit for synchronizing an asynchronous control signal in response to the synchronous signal to form a synchronized control signal; and
    a second circuit for activating the synchronous signal in response to an edge of the asynchronous control signal and deactivating the synchronous signal in response to an edge of the synchronized control signal;
    wherein the synchronous signal exhibits a frequency of oscillation that is great enough to allow the synchronous signal to complete at least one cycle during a time between consecutive edges of the asynchronous control signal.

11. The circuit of claim 10, wherein the first circuit comprises a synchronization register having a first input connected to receive the asynchronous control signal and an output to output the synchronized control signal.

12. The circuit of claim 11, wherein the synchronization register further comprises a second input connected to receive the synchronous signal.

13. The circuit of claim 10, wherein the second circuit comprises a synchronous set/reset circuit.

14. The circuit of claim 10, wherein the first circuit comprises means for synchronizing the asynchronous control signal in response to the synchronous signal to form the synchronized control signal.

15. The circuit of claim 10, wherein the second circuit comprises means for activating the synchronous signal in response to the edge of the asynchronous control signal and deactivating the synchronous signal in response to the edge of the synchronized control signal.

16. The circuit of claim 15, wherein the second circuit further comprises means for generating an event signal in response to the edge of the synchronized control signal, the event signal having first and second edges, wherein a processor action is commenced in response to the first edge of the event signal and ceased in response to the second edge of the event signal.

17. The circuit of claim 16, wherein the second circuit is constructed and arranged such that the synchronous signal is deactivated no sooner than the second edge of the event signal.

* * * * *